United States Patent [19]

Nishimura et al.

[11] Patent Number: 5,423,284

[45] Date of Patent: Jun. 13, 1995

[54] METHOD FOR GROWING CRYSTALS OF N-TYPE II-VI COMPOUND SEMICONDUCTORS

[75] Inventors: Kohsuke Nishimura, Kawagoe; Kazuo Sakai; Yasuyuki Nagao, both of Tokyo, all of Japan

[73] Assignee: Kokusai Denshin Denwa Kabushiki Kaisha, Tokyo, Japan

[21] Appl. No.: 209,485

[22] Filed: Mar. 14, 1994

Related U.S. Application Data

[63] Continuation of Ser. No. 868,058, Apr. 13, 1992, abandoned.

[30] Foreign Application Priority Data

Apr. 18, 1991 [JP] Japan ................... 3-112272

[51] Int. Cl.⁶ ........................................... C30B 25/04
[52] U.S. Cl. ........................................ 117/84; 117/88; 117/104; 434/103
[58] Field of Search ................... 117/84, 88, 104, 925, 117/953; 437/103, 106

[56] References Cited

U.S. PATENT DOCUMENTS

| | | | |
|---|---|---|---|
| 3,519,492 | 7/1970 | Humi et al. | 156/613 |
| 4,422,888 | 12/1983 | Stutius | 156/606 |
| 4,509,997 | 4/1985 | Cockayne et al. | 156/612 |
| 4,636,268 | 1/1987 | Tsang | 156/613 |
| 4,830,982 | 5/1989 | Dentai et al. | 156/606 |
| 4,876,222 | 10/1989 | Luttmer et al. | 437/225 |

*Primary Examiner*—R. Bruce Breneman
*Assistant Examiner*—Felisa Garrett
*Attorney, Agent, or Firm*—Emmanuel J. Lobato

[57] ABSTRACT

A method which permits the growth of high-quality crystals of n-type II-VI compound semiconductors containing sulfur, by suppressing the reaction of a group III or VII element as a dopant with a group II material at low temperature. A raw material gas containing an organometallic material of the group III or organic material of the group VII is premixed with a raw material gas containing organic sulfur material, then the premixture is mixed with a raw material gas containing an organometallic material of the group II, and the mixture is used to grow a crystal of an n-type II-VI compound semiconductor on a semiconductor substrate by a metal organic vapor phase epitaxial growth method.

12 Claims, 8 Drawing Sheets

METHOD FOR GROWING CRYSTALS OF N-TYPE II-VI COMPOUND SEMICONDUCTORS

This is a continuation of application Ser. No. 07/868,088, filed Apr. 13, 1992, now abandoned.

BACKGROUND OF THE INVENTION

The present invention relates to a method for growing n-type crystals of the II–VI compound semiconductors containing sulfur.

With a metal organic vapor phase epitaxial growth method (hereinafter referred to as an MOVPE method) for the II–VI compound semiconductors, the use of hydrides (such as hydrogen sulfide, hydrogen selenide, etc.) as raw materials of the group VI elements permits the growth of crystals at as low a temperature as 300° C. or so, and hence keeps the crystals from deterioration by temperature changes from growth temperature to room or ambient temperature. On the other hand, however, the hydrogen compound materials of the group VI elements react with organometallic materials of the group II elements (dialkyl cadmium, dialkyl zinc, etc.) even at low temperatures such as room temperature, and to avoid this, it is necessary to mix these raw materials at close vicinity of a semiconductor substrate one which the II–VI compound crystal is grown. This leads to scattering in the thicknesses, qualities, etc. of grown layers. As a solution to this problem, there has been proposed a crystal growth method which employs, raw materials of the group VI elements which do not react with the organometallic materials of the group II elements, alkyl compounds (diethl sulfur, dimethyl sulfur, tertiary butyl mercaptan, diethyl selenium, dimethyl selenium, ethyl selenol, etc.) which are organic compounds, and experiments on this method have also been conducted.

With the prior art described above, an organometallic material of the group III (trialkyl indium, trialkyl gallium, or the like) or organic material of the group/VII (alkyliodide, alkylbromide, or the like), which is used as a dopant for forming an n-type growth layer, reacts with the group II element materials at low temperatures, resulting in a serious reduction of the growth rate and deterioration of the growth layer. Moreover, due to the vapor pressure of the by-product indium gets mixed into a non-doped layer subsequently formed, and consequently, the carrier concentration of the non-doped layer does not decrease and the composition of the n-type layer differs from the intended value, resulting in the quality of the crystal being impaired.

SUMMARY OF THE INVENTION

It is therefore an object of the present invention to provide a method which permits the growth of high-quality crystals of n-type II–VI compound semiconductors containing sulfur, by suppressing the reaction of the group III or VII element as dopant with the group II element material at low temperatures.

To attain the above objective, according to the present invention, a raw material gas containing an organometallic material of the group III or organic raw material of the group VII and a raw material gas containing an organic sulfur material are premixed, then the premixture is mixed with a raw material gas containing an organometallic material of the group II element, and the mixture is used to grow a crystal of an n-type II–VI compound semiconductor on a semiconductor substrate by the MOVPE method.

With the present invention, the dopant material of the group III (or dopant material of the group VII) is premixed with the organic sulfur material to form a vapor-phase additive called adduct, by which it is possible to suppress the reaction of the dopant with the group II element material at low temperatures.

That is, the organic sulfur material and the organic material of the group III (or organic material of the group VII) are premixed in a different system and is introduced into a reaction tube independently of the group II element material, and consequently, the organic sulfur material and the group III element material are combined with each other to form the above-mentioned additive. Since the additive does not react with the group II element material at low temperatures, it is possible to prevent the reaction of the dopant material with the group II element material at low temperatures.

BRIEF DESCRIPTION OF THE DRAWINGS

The present invention will be described in detail below in comparison with prior art with reference to the accompanying drawings, in which.

DETAILED DESCRIPTION

To make differences between prior art and the present invention, a conventional system will first be described.

Figure 8:
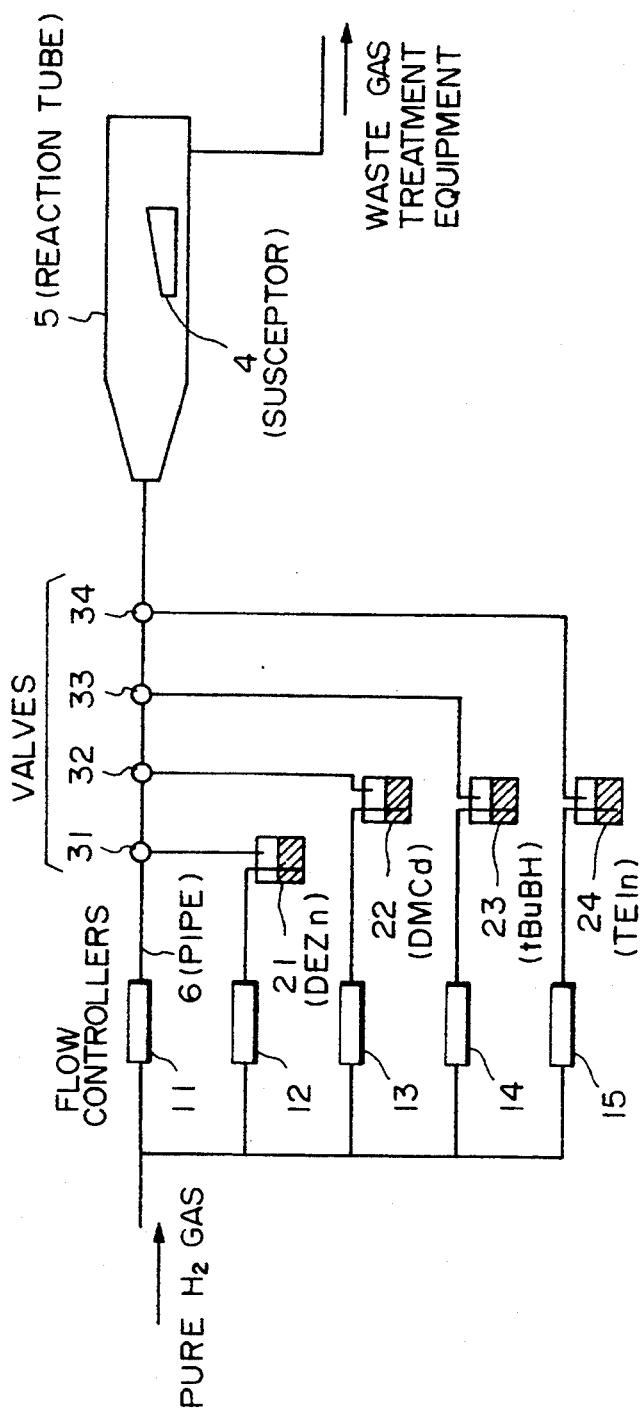
FIG. 8 is a system diagram showing a conventional MOVPE system for cadmium zinc sulfide.

FIG. 8 shows a conventional MOVPE system using n-type cadmium zinc sulfide (CdZnS). Reference numerals 11 to 15 indicate massflow controllers or similar flow controllers, 21 diethylzinc (DEZn) which is an organic zinc material of the group II, 22 dimethylcadmium (DMCd) which is an organic cadmium material of the group II, 23 tertiary butyl mercaptan (tBuSH) which is an organic sulfur material, 24 triethyl indium (TEIn) which is an organic material dopant of the group III, 31 to 34 valves, 4 a susceptor on which a substrate is plated, and 5 a reaction tube made of quartz glass. Pure hydrogen gas, which serves as a carrier gas, is introduced into each flow controller from the left-hand side of the drawing and is supplied therethrough to each raw material at a fixed flow rate to bubble it. In consequence, the raw materials are vaporized and carried together with the carrier gas into a pipe 6 via the valves, in which they are mixed. The mixture is introduced into the reaction tube 5, in which it is thermally decomposed by the susceptor 4 heated by inductive heating or the like, and as a result, cadmium zinc sulfide is laminated on a GaAs substrate placed on the susceptor 4. The gas remaining after the decomposition is discharged after being treated by waste gas treatment equipment depicted at the right-hand side of the drawing.

With the prior art described above, an organometallic material of the group III (trialkyl indium, trialkyl gallium, or the like) or organic material of the group VII (alkyliodide, alkylbromide, or the like), which is used as a dopant for forming an n-type growth layer, reacts with the group II element materials at low temperatures, resulting in a serious reduction of the growth rate and deterioration of the growth layer.

In FIG. 8, in the pipe 6 or before reaching the susceptor 4 after being introduced into the reaction tube 5, the group II element materials (DEZn, DMCd) and the group III element material (TEIn) react with each other to precipitate a by-product in the pipe 6 or reaction tube 5. As the result of this, the amount of raw material supplied to the susceptor 4 decreases and the growth rate of the n-type layer goes down to about 1/10 the growth rate of a non-doped layer for which the group III element material is not supplied. Moreover, the by-product precipitated in the pipe 6 or the reaction tube 5 hinders opening and closing of the valves 31 to 34, besides due to the vapor pressure of the by-product indium gets mixed into a non-doped layer subsequently formed, and consequently, the carrier concentration of the non-doped layer does not decrease and the composition of the n-type layer differs from the intended value, resulting in the quality of the crystal being impaired.

With reference to the accompanying drawings, the present invention will hereinafter be described in detail.

EMBODIMENT 1

Figure 1:
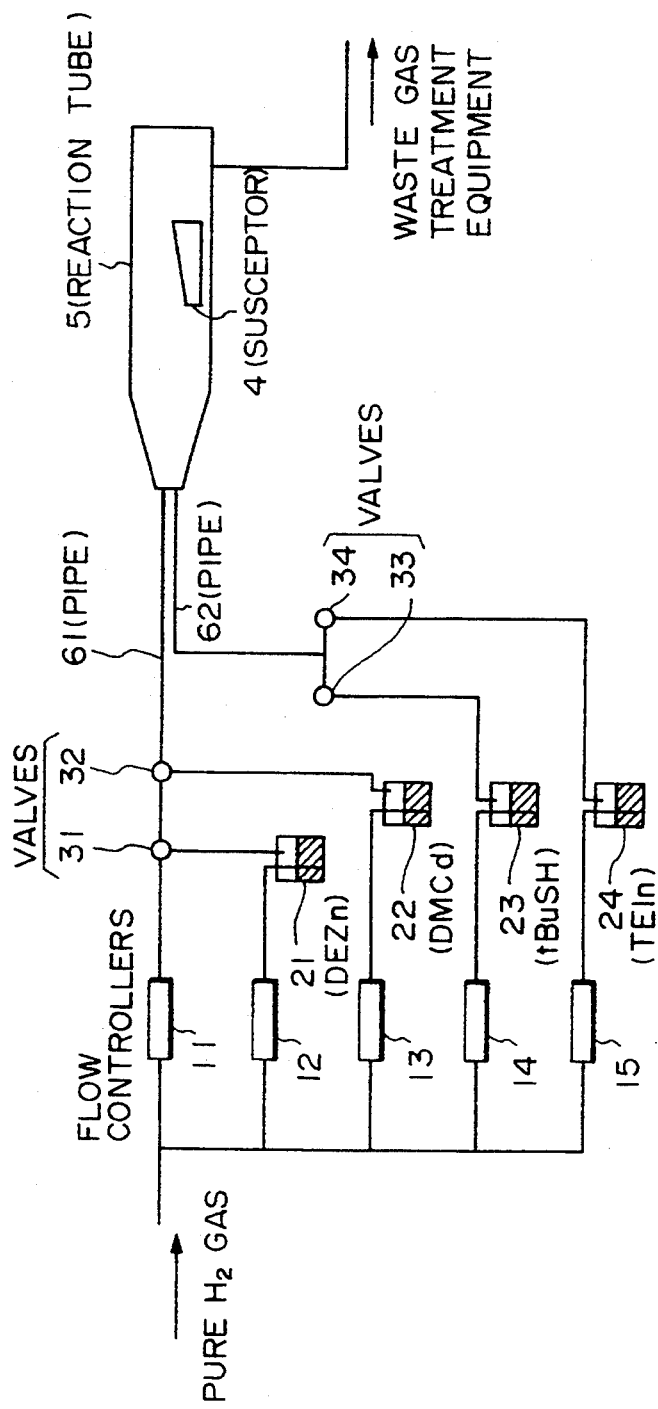
FIG. 1 is a system diagram illustrating an MOVPE system for cadmium zinc sulfide according to an embodiment of the present invention.

FIG. 1 schematically illustrated an MOVPE system for cadmium zinc sulfide which is a II–VI compound semiconductor, in accordance with an embodiment of the present invention. Reference numerals 11 through 15 denote flow controllers such as massflow controllers, 21 diethylzinc (DEZn) which is an organic zinc material of the group II, 22 dimethyl cadmium (DMCd) which is an organic cadmium material of the group II, 23 tertiary butyl mercaptan (tBuSH) which is an organic sulfur material, 24 triethylindium (TEIn) which is an organic material dopant of the group III, 4 a susceptor on which a substrate is placed, and 5 a reaction tube made of quartz glass. Valves 31 and 32 are connected to a pipe 61 and valves 33 and 34 are connected to a pipe 62. The diethylzinc (DEZn) and the dimethylcadmium (DMCd), which are group II element materials, are mixed together in the pipe 61. The tertiary butyl mercaptan (tBuSH), which is an organic sulfur material, and the triethylindium (TEIn), which is a group III element material, are mixed together in the pipe 62. The mixtures are respectively introduced into the reaction tube 5.

Thus, according to this system, a raw material gas containing the triethylindium (TEIn) which is an organometallic material of the group III and a raw material gas containing the tertiary butyl mercaptan (tBuSH) are premixed in the pipe 62, then the premixture is introduced into the reaction tube 5, in which it is mixed with a raw material gas containing the diethylzinc (DEZn) and the dimethylcadmium (DMCd), which are organometallic materials of the group II and mixed together in the pipe 61. As a result, a crystal of an n-type II–VI compound semiconductor CdZnS can be grown on a semiconductor substrate mounted on the susceptor 4 disposed in the reaction tube 5.

With such a method, the triethylindium (TEIn) and the tertiary butyl mercaptan (tBuSH) form a stable adduct in the pipe 62, suppressing the reaction of the group II element material with the triethylindium at low temperature. Furthermore, since the pipes 61 and 62 are independent of each other except that they are connected to the reaction tube 5 in common, it is possible to prevent the precipitation of by-products in at least the pipes 61 and 62. Thus, no bad influence is caused by the afore-mentioned low-temperature reaction so that a growth layer of high quality can be obtained at exactly the same growth rate as that of a non-doped layer.

EMBODIMENT 2

Figure 2:
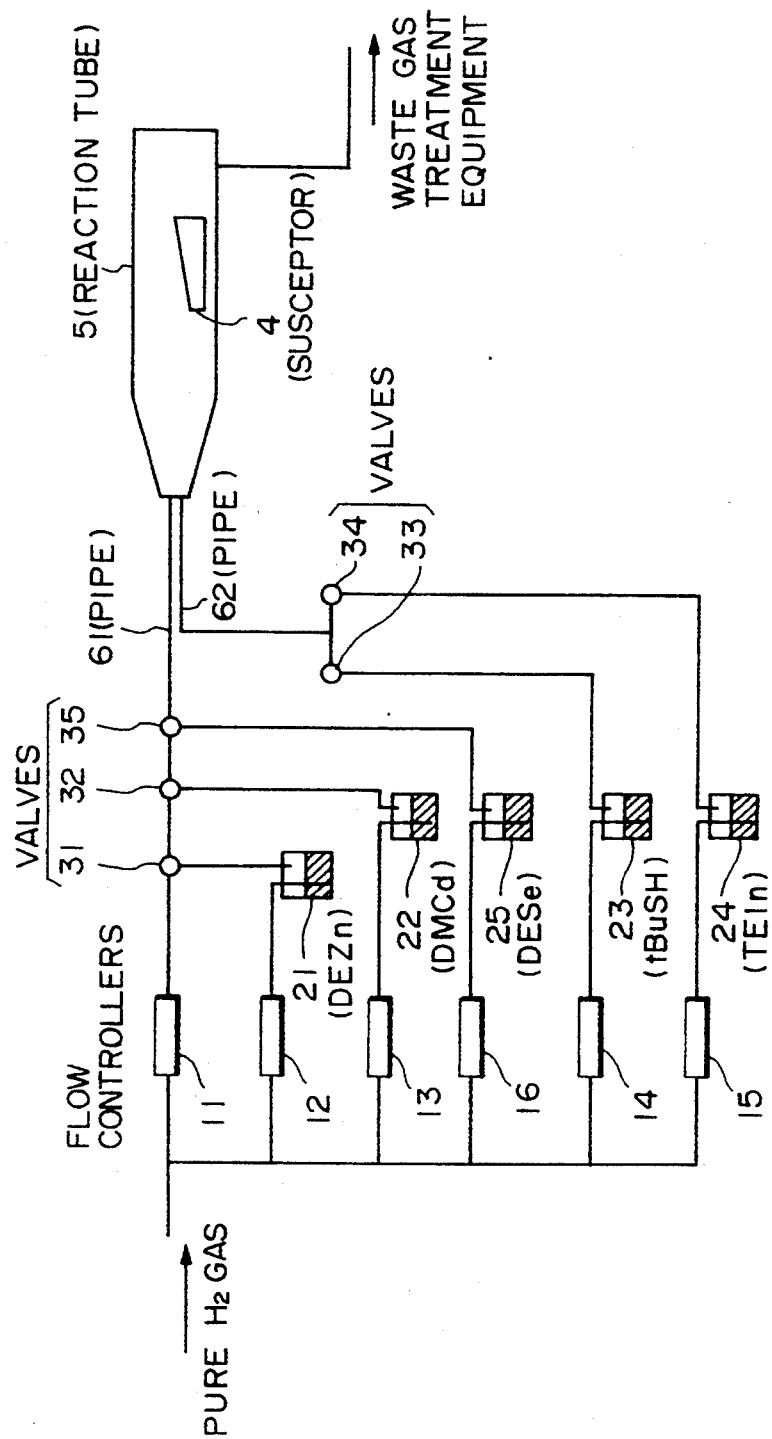
FIG. 2 is a system diagram illustrating an MOVPE system for cadmium zinc sulfo selenide according to another embodiment of the present invention.

While Embodiment 1 has been described in connection with the case of cadmium zinc sulfide (CdZnS), the present invention permits the growth of crystals of group II compound semiconductors, as long as they contain sulfur. FIG. 2 schematically illustrated another embodiment of the invention applied to an MOVPE system for cadmium zinc sulfo selenide ($Cd_xZn_{1-x}S_ySe_{1-y}$). Reference numeral 25 indicates diethyselenium (DESe), which is supplied via the valve 35 to the pipe 61. Except this, the illustrated system is identical in construction with that depicted in FIG. 1.

Figure 3:
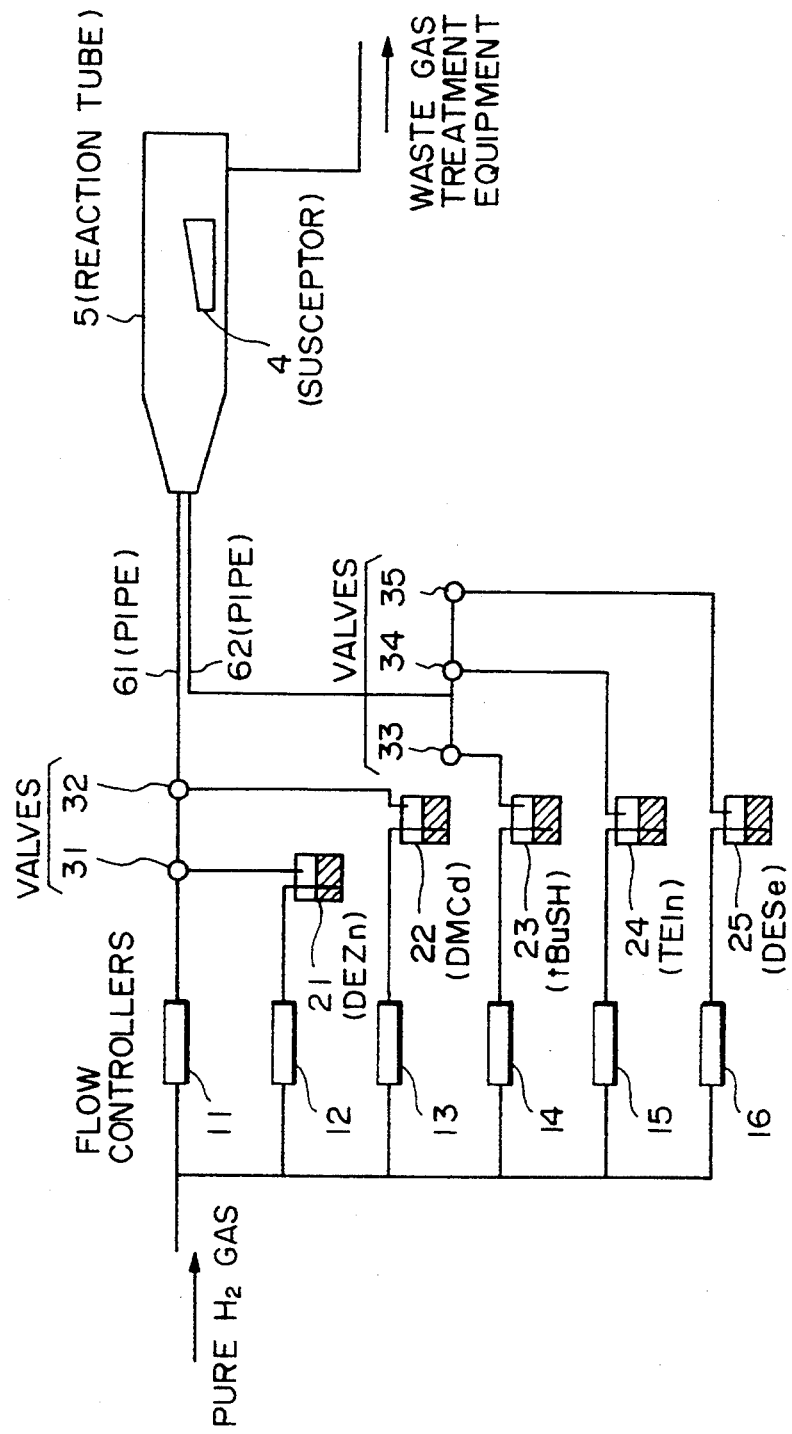
FIG. 3 is a system diagram illustrating an MOVPE system for cadmium zinc sulfo selenide according to another embodiment of the present invention.

The diethylselenium (DESe) which is a selenium material does not react at low temperatures with the triethylindium which is a group III material, and hence it may also be mixed with the tertiary butyl mercaptan (tBuSH) and triethylindium (TEIn) in the pipe 62 as shown in FIG. 3.

Moreover, the II–VI compound semiconductors which are grown as crystals are described to be ternary mixed crystals in Embodiments 1 and 2, but the present invention is not limited specifically to them and is applicable as well to the MOVPE method for binary compounds such as ZnS and CdS, ternary compounds such as ZnSSe, or quinary or higher II–VI compounds, as long as they contain sulfur. It does matter, of course, to contain mercury (Hg) and magnesium (Mg) as the group II elements and oxygen (O) and tellurium (Te) as the group VI elements.

As the organic sulfur material which is a group VI element material, diethylsulfur may also be used as a substitute for the tertiary butyl mercaptan (tBuSH). Other organic sulfur materials, though different in stability, combine with the group III element material to form an adduct, and hence provide the same results as mentioned above.

The dopant of the group III element is not limited specifically to the triethylindium (TEIn) either. The same results as mentioned above are also obtainable with the use of trimenthylindium, ethyldimethyl indium, triethyl gallium, trimethyl gallium, and so forth.

Furthermore, some organic materials of the group VII elements which serve as n-type dopants for the II–VI elements, such as hexane iodide, ethyl iodide and butyl bromide, produce the same effects as mentioned above.

FIGS. 4 through 7 are graphs showing various characteristics of non-doped layers and n-type doped layers grown by the conventional method shown in FIG. 8 and this invention method shown in FIG. 1. In all experiments the substrates used were chromium-oxygen doped semi-insulating (100) plane GaAs substrates. The diethyl-zinc (DEZn) and the dimethylcadmium (DMCd) were supplied at fixed flow rates of 5.55 and 6.20 μmol/min, respectively. The time for growth is one hour. The growing temperature is of 350° C., while the growing pressure in of 300 torr. The lattice constants of non-doped CdZnS grown layers measured by double crystal X-ray diffractometry were all substantially equal to the lattice constants of the GaAs substrates, hence the composition of the mixed crystal is $Cd_{0.55}Zn_{0.45}S$.

Figure 4:
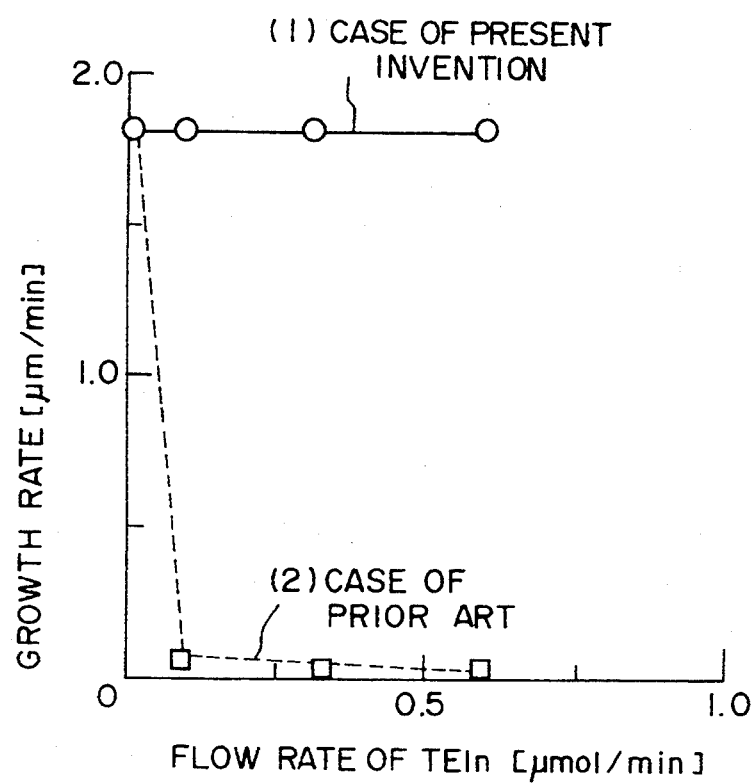
FIG. 4 illustrates graphs showing relationships between a flow rate of triethylindium and a growth rate of a CdZnS layer in cases of using the method of the present invention and the conventional method.

FIG. 4 shows relationship between the flow rate of the triethylindium (TEIn), which is the group III element material, and the growth rates of the CdZnS layers in the cases (1) and (2) of using this invention method depicted in FIG. 1 and the conventional method depicted in FIG. 8. As will be seen from FIG. 4, according to the conventional method, even if a very small amount of triethylindium (TEIn) at a rate of 0.1 μmol/min, as compared with the group II element, is added, the growth rate drops to about 1/10 that of the non-dope layer. With the use of the present invention, however, an increase in the flow rate of triethylindium (TEIn) does not ever cause a decrease in the growth rate.

Figure 5:
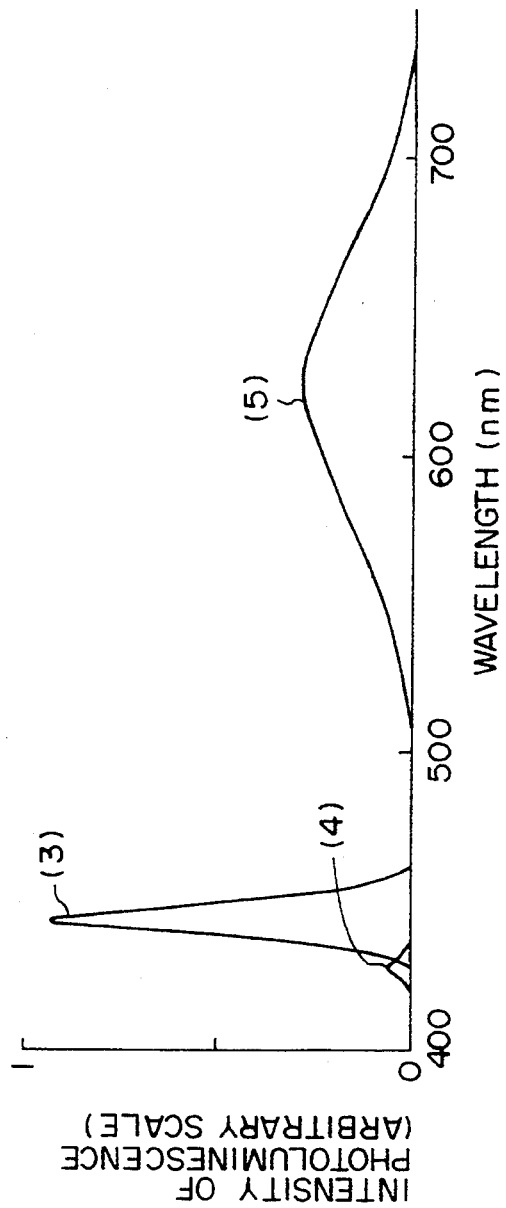
FIG. 5 illustrates graphs showing intensity of photoluminescence of CdZnS layers by a conventional method at room temperature.

FIG. 5 shows photoluminescence spectrums, at room temperature, of a non-doped CdZnS grown layer and a CdZnS grown layer doped with the triethylindium (TEIn) at a flow rate of 0.6 μmol/min according to the prior art method. The ordinate represents the intensity of photoluminescence and the abscissa its wavelength. The flow rates of diethylzinc (DEZn) and the dimethylcadmium (DMCd) are equal to those in FIG. 4. FIG. 5 clearly reveals problems of the prior art. The photoluminescence of the non-doped CdZnS grown layer has an expected normal intensity. On the other hand, the photoluminescence of the doped CdZnS grown layer has two low intensities. The peak wavelength of near-band-edge emission of the doped layer deviates, as shown by (4), toward the short wavelength side more than in the case (3) of the non-doped layer. This means that the dimetylcadmium reacts with the triethylindium more than the diethylzinc and hence is consumed accordingly, resulting in the composition of the doped layer deviating to a zincrich composition as compared with the non-doped layer. Moreover, the intensity of near-band-edge emission goes down to 1/10 or less than the intensity of near-band-edge emission of the non-doped layer owing to the deterioration of the crystal, and the emission of light from deep levels increases, as shown by (5), which is caused by a crystal defect or the like.

Figure 6:
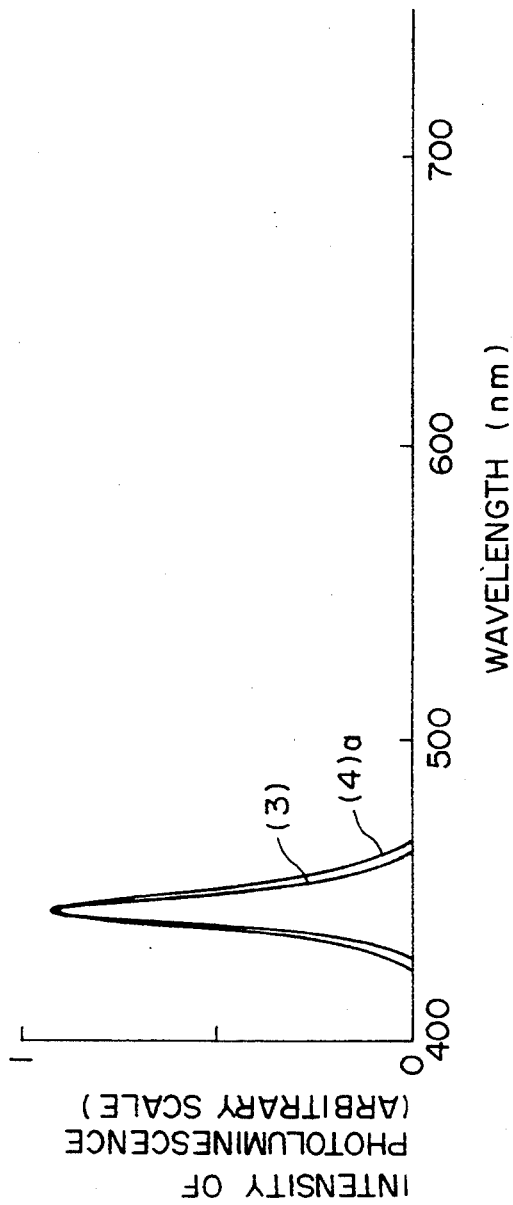
FIG. 6 illustrates graphs showing intensity of photoluminescence of CdZnS layers by the method of the present invention at room temperature.

FIG. 6 shows photoluminescence spectrums (3) and (4) a, at room temperature, of a non-doped CdZnS grown layer and a CdZnS grown layer doped with triethylindium (TEIn) at a flow rate of 0.6 μmol/min according to the method of the present invention. The ordinate represents the intensity of photoluminescence and the ordinate its wavelength. The non-doped layer and the doped layer are both equal in the wave-length and intensity of near-band-edge emission and the intensity of light emitted from the deep levels. This indicates that the compositions and quality of crystal of the both layers are substantially the same.

Figure 7:
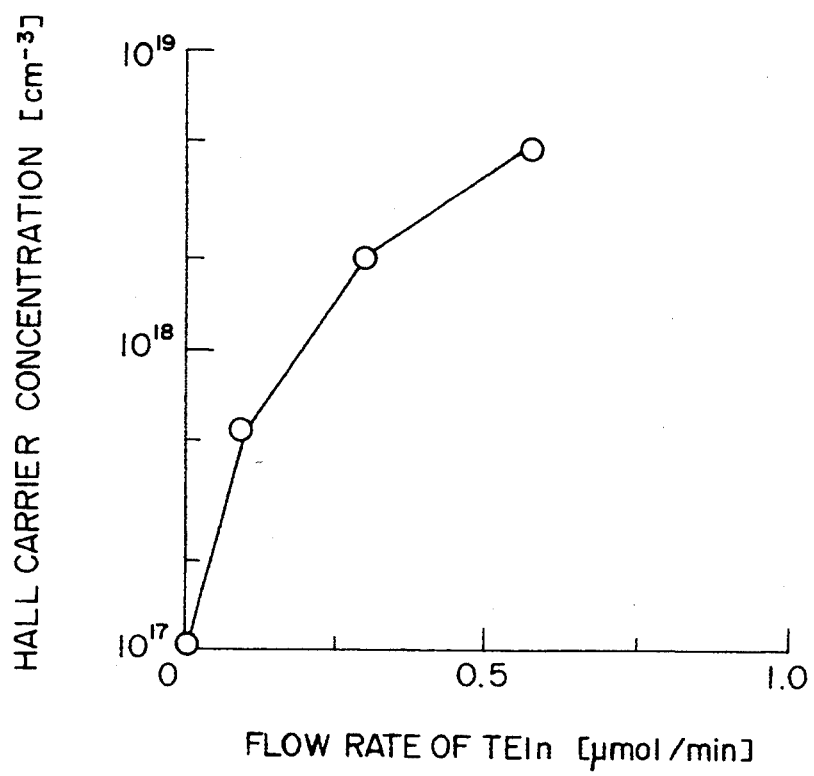
FIG. 7 is a graph showing the Hall carrier concentration of a CdZnS layer plotted against the flow rate of triethylindium in case of using the method of the present invention.

FIG. 7 shows a plot of the carrier concentration of the triethyindium-doped CdZnS layer grown by this invention method of FIG. 1, measured by a Hall effect measurement, against the flow rate of the triethylindium. The carrier concentration is $5 \times 10^{18}$ cm$^{-3}$ when the flow rate of the triethylindium is 0.6 μmol/min. On the other hand, in the case of a doped layer by the conventional method (FIG. 8), it was difficult even to make contact with an electrode irrespective of the amount of dopant and the carrier concentration could not be measured in terms of the Hall effect. It appears from the photoluminescence spectrums that this is because many deep levels based on defects are formed in the crystal and trap carriers.

As described above, the present invention permits the formation of n-type II–VI element crystals of high quality. Hence, the invention is applicable to the growth of various crystals such as the epitaxial growth of II–VI compound crystals for a short-wavelength light source, or growth of a III–V compound waveguide buried structure.

What we claim is:

1. A method for growing a crystal of an n-type II–VI compound semiconductor, comprising:

premixing a first raw material gas containing an organometallic material of the group III or organic material of the group VII with a second raw material gas containing an organic sulfur material to produce a premixture, mixing the premixture with a third raw material gas containing an organometallic material of the group II to produce a mixture, and growing said crystal of said n-type II–VI compound semiconductor on a semiconductor substrate by a metal organic vapor phase epitaxial growth method using the mixture, and said organic sulfur material being tertiary butyl mercaptan.

2. A method for growing a crystal of an n-type II–VI compound semiconductor according to claim 1, in which said organometallic material of the group III is triethylindium, trimethylindium, ethyl dimethylindium, triethyl gallium, or trimethyl gallium.

3. A method for growing a crystal n-type II–VI compound semiconductor according to claim 1, in which said II–VI compound semiconductor is cadmium zinc sulfo selenide ($Cd_xZn_{1-x}S_ySe_{1-y}$, where $0 \leq x \leq 1$ and $0 < y \leq 1$).

4. A method for growing a crystal of an n-type II–VI compound semiconductor, comprising:

premixing a first raw material gas containing an organometallic material of the group III or organic material of the group VII with a second raw material gas containing an organic sulfur material to produce a premixture, mixing the premixture with a third raw material gas containing an organometallic material of the group II to produce a mixture, and growing said crystal of said n-type II–VI compound semiconductor on a semiconductor substrate by a metal organic vapor phase epitaxial growth method using the mixture, and said organic material of the group VII is ethyliodide, hexane iodide, or butylbromide.

5. A method for growing a crystal of an n-type II–VI compound semiconductor according to claim 4, in which said organometallic material of the group III is triethylindium, trimethylindium, ethyl dimethylindium, triethyl gallium, or trimethyl gallium.

6. A method for growing a crystal n-type II–VI compound semiconductor according to claim 4, in which said II–VI compound semiconductor is cadmium zinc sulfo selenide ($Cd_xZn_{1-x}S_ySe_{1-y}$, where $0 \leq x \leq 1$ and $0 < y \leq 1$).

7. A method for growing a crystal of an n-type II–VI compound semiconductor, comprising:
   premixing a first raw material gas containing an organometallic material of the group III or organic material of the group VII with a second raw material gas containing an organic sulfur material to produce a premixture, mixing the premixture with a third raw material gas containing an organometallic material of the group II to produce a mixture, and growing said crystal of said n-type II–VI compound semiconductor on a semiconductor substrate by a metal organic vapor phase epitaxial growth method using the mixture,
   said organic sulfur material being tertiary butyl mercaptan, and
   said organic material of the group VII being ethyliodide, hexane iodide, or butylbromide.

8. A method for growing a crystal of an n-type II–VI compound semiconductor according to claim 7, in which said organometallic material of the group III is triethylindium, trimethylindium, ethyl dimethylindium, triethyl gallium, or trimethyl gallium.

9. A method for growing a crystal n-type II–VI compound semiconductor according to claim 7, in which said II–VI compound semiconductor is cadmium zinc sulfo selenide ($Cd_xZn_{1-x}S_ySe_{1-y}$, where $0 \leq x \leq 1$ and $0 < y \leq 1$).

10. A method for growing a crystal of an n-type II–VI compound semi-conductor, comprising:
    premixing a first raw material gas containing an organometallic material of the group III or organic material of the group VII with a second raw material gas containing an organic sulfur material to produce a premixture;
    mixing the premixture with a third raw material gas containing an organometallic material of the group II to produce a mixture; and
    growing said crystal of said n-type II–VI compound semiconductor on a semiconductor substrate by a metal organic vapor phase epitaxial growth method using the mixture.

11. A method for growing a crystal of an n-type II–VI compound semiconductor according to claim 10, in which said organometallic material of the group III is triethylindium, trimethylindium, ethyl dimethylindium, triethyl gallium, or trimethyl gallium.

12. A method for growing a crystal of an n-type II–VI compound semiconductor according to claim 10, in which said II–VI compound semiconductor is cadmium zinc sulfo selenide ($Cd_xZ_{1-x}S_ySe_{1-y}$, where $0 \leq x \leq 1$ and $0 \leq y \leq 1$).

* * * * *